United States Patent
Matsuno

(10) Patent No.: US 8,911,675 B2
(45) Date of Patent: Dec. 16, 2014

(54) DISCHARGE CELL FOR OZONIZER

(75) Inventor: Takashi Matsuno, Hyogo (JP)

(73) Assignee: Sumitomo Precision Products Co., Ltd., Amagasaki-shi (JP)

( * ) Notice: Subject to any disclaimer, the term of this patent is extended or adjusted under 35 U.S.C. 154(b) by 2176 days.

(21) Appl. No.: 11/687,754

(22) Filed: Mar. 19, 2007

(65) Prior Publication Data

US 2008/0245659 A1 Oct. 9, 2008

(30) Foreign Application Priority Data

Mar. 22, 2006 (JP) .................................. 2006-078120

(51) Int. Cl.
- *C25B 9/00* (2006.01)
- *B01J 19/08* (2006.01)
- *C01B 13/11* (2006.01)
- *H01J 37/32* (2006.01)

(52) U.S. Cl.
CPC .................. *C01B 13/11* (2013.01); *H01J 37/32* (2013.01); *H01J 37/3255* (2013.01); *C01B 2201/12* (2013.01); *C01B 2201/22* (2013.01); *C01B 2201/34* (2013.01); *C01B 2201/64* (2013.01)
USPC ................................ 422/186.07; 422/186.15

(58) Field of Classification Search
CPC ...... H01J 37/32; H01J 37/3255; C01B 12/11; C01B 2201/22
USPC ........................................ 422/186.07, 186.15
See application file for complete search history.

(56) References Cited

U.S. PATENT DOCUMENTS

| 6,046,533 A * | 4/2000 | Nakatsuka ................ 313/362.1 |
| 7,944,122 B2 * | 5/2011 | McNamara et al. .......... 310/339 |
| 2003/0116541 A1 * | 6/2003 | Chiou et al. ............. 219/121.51 |
| 2006/0049738 A1 * | 3/2006 | Tabata et al. ............... 313/362.1 |
| 2008/0245659 A1 | 10/2008 | Matsuno |

FOREIGN PATENT DOCUMENTS

WO  WO 2005/080263  9/2005

OTHER PUBLICATIONS

U.S. Appl. No. 11/946,417, filed Nov. 28, 2007, Matsuno.
U.S. Appl. No. 11/563,393, filed Nov. 27, 2006, Matsuno.
Jun. 10, 2011, letter from DLA Piper LLP with enclosures.

* cited by examiner

*Primary Examiner* — Lyle Alexander
(74) *Attorney, Agent, or Firm* — Oblon, Spivak, McClelland, Maier & Neustadt, L.L.P.

(57) ABSTRACT

To prevent the decrease of ozone concentration in the case that high purity oxygen without adding nitrogen is used as the raw material gas in a discharge type ozonizer. In an ozonizer in which a dielectric 10 is arranged contacting at least one of electrodes 30 to form a discharge gap 20 for the generation of ozone between a pair of electrodes 30, 30, a transition metal bronze containing alkaline metals alkaline earth metals or rare earth metals at position A of the transition metal oxide having a crystal structure in which an atom does not exist at position A of the perovskite structure is made to exist on the above-described surface of the dielectric 10.

7 Claims, 1 Drawing Sheet

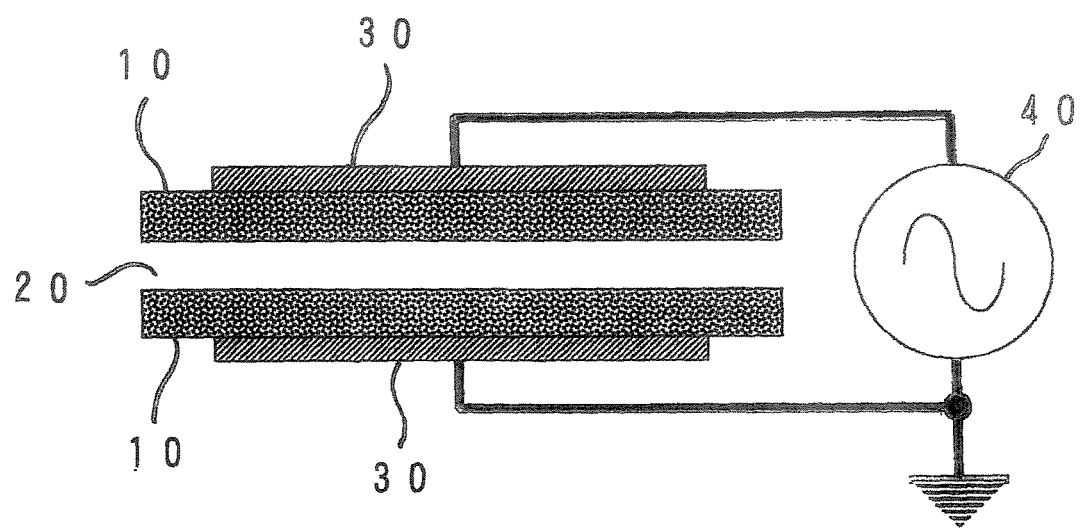

DISCHARGE CELL FOR OZONIZER

BACKGROUND OF THE INVENTION

1. Field of the Invention

The present invention relates to a discharge cell used in a discharge type ozonizer.

2. Description of the Related Art

Discharge cells used in a discharge type ozonizer called an ozonizer are roughly divided into plate types and tube types. Either type of the discharge cell has a pair of electrodes arranged with a gap between them, and has a configuration in which a dielectric is arranged between the electrodes contacting the surface of at least one of the pair of the electrodes to form a discharge gap between the electrodes. Then ozone gas is produced by circulating a raw material gas such as oxygen in a state that a fixed high-frequency high-voltage is applied to the discharge gap and silent discharge is generated.

Recently, in order not to expose the electrodes made of metal to the discharge gap, a configuration has been increasingly emerging to form a discharge gap between a pair of dielectrics by arranging a pair of dielectrics inside each of the paired electrodes. Furthermore, a multi-layered structure has been used a lot in which this configuration is considered as one unit, and a plurality of the units are layered in the direction of the thickness.

The dielectric in the discharge cell is roughly divided by shape into a substrate type having rigidity and a coated type in which the surface of the gap side of the rigid electrodes is coated. In the case of the coated type, nonuniformity of the thickness distribution cannot be avoided, there is a problem that it leads to nonuniformity of the gap amount of the discharge gap, and the substrate type such as a ceramic plate that is hard and strong chemically has recently become mainstream.

Incidentally, an ozonizer is used in various chemical treatment equipments on the one hand and began to be used broadly in semiconductor manufacturing equipment. In the case of an ozonizer for semiconductor manufacturing used in formation of an oxide film, ashing of a resist, cleaning of a silicon wafer, etc., because high cleanliness is demanded, it is necessary to generate pure ozone gas with extremely small contamination (metal impurities and particles), and because of this, oxygen of high purity is used as the raw material gas.

Further, an alumina substrate of high purity that has a high mechanical strength and that is excellent in ozone resistance, sputtering resistance, etc., is recommended as a substrate type dielectric in the respect of securing cleanliness. Furthermore, from the necessity of producing ozone gas of high concentration, reducing and uniformizing the gap amount in the discharge gap are attempted together with high purification of the oxygen gas, and a gap amount that has been reduced to 0.2 mm or less can be seen currently.

In the case of using oxygen gas of high purity as the raw material gas, it has already widely been known that there is a problem that the ozone concentration of ozone gas rapidly decreases right after the operation is started and the prescribed performance does not appear. In order to solve the problem, it is considered to be effective to add a small amount of catalyst gas to the oxygen gas of high purity, and nitrogen gas of high purity that is easily obtained in a semiconductor manufacturing process has been used a lot as the catalyst gas.

The case that the dielectric is the above-described high purity alumina substrate is also not an exception, and in the case that the raw material gas is oxygen gas of high purity, the performance as an ozonizer hardly appears. Furthermore, in the case of the high purity alumina substrate, it has been clear that the ozone concentration does not increase sufficiently even when nitrogen gas is mixed to the oxygen gas. In more detail, in the case of arranging the high purity alumina substrate on both faces of the discharge gap, especially the effect of adding the catalyst gas cannot be obtained sufficiently. This is considered to be because impurities are removed extremely from the surface of the dielectric contacting the discharge gap.

From these circumstances, an attempt to increase the ozone concentration without using a catalyst gas has proceeded in various fields, and one of them is the use of titanium oxide to the dielectric described in Japanese Patent Application Laid-Open (JP-A) No. 11-21110 and JP-A No. 2005-350336, etc. Further, a coating of a tungsten-based substance to the surface of the dielectric has been considered as shown in U.S. Pat. No. 5,932,180 and JP-A No. 2005-320223.

By coating the surface of the dielectric with the titanium oxide described in Japanese Patent Application Laid-Open (JP-A) No. 11-21110 and JP-A No. 2005-350336 or incorporating it in the entire dielectric, the concentration of the ozone gas can be increased. However, in the case that the purity of the oxygen gas, which is the raw material gas, is 99.9% or more, the ozone concentration does not increase without adding nitrogen gas. However, by adding nitrogen gas at a small amount (for example, about 0.5 vol %), the ozone concentration increases rapidly, and it becomes possible to draw out the ability of an ozonizer to the fullest. That is, titanium oxide has the effect of reducing the amount of nitrogen gas used. However, the effect of increasing the ozone concentration without adding nitrogen gas is small.

On the other hand, concerning the tungsten-based substance, the surface of the dielectric is coated with metal tungsten in U.S. Pat. No. 5,932,180, and the surface of the dielectric contacting to the discharge gap and the surface of the electrodes are coated with tungsten oxide having a fixed electric resistivity in JP-A No. 2005-320223.

In U.S. Pat. No. 5,932,180, the surface of the dielectric is coated with metal tungsten. However, this metal tungsten changes into tungsten oxide ($WO_3$) by a strong oxidizing-power of ozone produced in the discharge gap, and the surface of the dielectric is considered to be actually coated with this $WO_3$. Incidentally, $WO_3$ is an insulator.

Against this, in JP-A No. 2005-320223, the surface of the dielectric contacting to the discharge gap and the surface of the electrodes are coated with a conductive tungsten oxide having a fixed resistivity. Among the tungsten oxides, $WO_3$ is an electrical insulator. However, the conductivity of $WO_2$ is good and it is a fact that the resistivity of the tungsten oxide can be changed by changing the amount of oxygen. However, because this conductive tungsten oxide also contacts to the discharge gap and directly contacts to ozone, $WO_X$ (X<3) is considered to change to $WO_3$, which is an insulator, as it is being used after all.

That is, the face contacting to the discharge gap is considered to be coated with $WO_3$ in the discharge cell to be actually used, also in the technology described in U.S. Pat. No. 5,932,180 and the technology described in JP-A No. 2005-320223 even though the expression is different.

However, in order for the present inventors to confirm the effectiveness of $WO_3$, when the surface of the dielectric was coated with $WO_3$, or $WO_3$ was compounded in the dielectric, it was confirmed that the effect of increasing the ozone concentration is substantially larger than $TiO_2$ in the case without adding oxygen. However, it does not result in drawing out the ability of the ozonizer to the fullest. If anything, even though nitrogen gas is added in a small amount, its effect is not much improved and it does not result in drawing out the ability of the ozonizer to the fullest. That is, the ozone concentration in the case of adding a small amount of nitrogen gas becomes higher with $TiO_2$ than $WO_3$.

SUMMARY OF THE INVENTION

The objective of the present invention is to provide a discharge cell for an ozonizer that is capable of drawing out the ability of the ozonizer to the fullest in the case of adding no nitrogen gas.

There are various theories on the reason of the phenomenon that the ozone concentration decreases in the case of using oxygen gas of high purity as the raw material gas in the discharge cell of an ozonizer, and a so-called established theory does not yet exist. For example, in JP-A No. 2005-320223, due to an excess accumulation of a negative charge (ions such as $O_2^-$ and $O_3^-$) on the surface of the dielectric, an electron current ratio k (a ratio of the energy consumption by an electron contributing to the production of ozone to the energy consumption by an ion not contributing to the production of ozone) decreases, and this is considered to lead to the reduction of the efficiency of ozone production, and from this point of view, suppression of the accumulation of the negative charge by lowering the electric resistivity of the surface of the dielectric is considered to be effective in improving the efficiency of ozone production.

Against this, there are not quite a few researchers who focus the activity of ozone as the reason of the phenomenon that the ozone concentration decreases in the case of using oxygen gas of high purity. That is, ozone ($O_3$) has an extremely strong oxidizing-power. This means that ozone ($O_3$) produced from oxygen ($O_2$) goes back to oxygen ($O_2$) instantly. That is, there is a view that although ozone is very unstable and produced sufficiently also in the case of using oxygen gas of high purity, the ozone goes back to oxygen, and as the result, the ozone concentration does not increase. Then it is considered that ozone is excited and the energy level has been raised more than necessary. This is also the reason why to increase the ozone concentration is said to have the same meaning as to prevent the decomposition of the produced ozone.

From the circumstances above, the inventors of the present invention considered that it is indispensable to satisfy the following two conditions in order to prevent the reduction of ozone in the case of using oxygen gas of high purity. One condition is to make a substance stabilizing ozone by absorbing the excess energy of the produced ozone, specifically a substance having a vacancy of oxygen, exist on the surface of the dielectric from the consideration that the ozone stabilizes by lowering the excess energy level of the produced ozone, its decomposition is suppressed, and as the result, the ozone concentration increases. Another is that the substance is a stable substance that does not oxidize even when it contacts to ozone.

The inventors of the present invention focused on a transition metal bronze as a substance satisfying these two conditions. The transition metal bronze is explained as using tungsten (W) as an example. $WO_3$ has the same crystal structure as $ReO_3$. However, because the valence electrons of W are fewer than the valence electrons of Re by one, $WO_3$ becomes an insulator. However, its crystal structure has no atom at position A of the perovskite structure as there is in $ReO_3$, and a large tunnel exists in three directions connecting the corners of the simple cube lattice. The crystal structures containing a hydrogen atom, an alkaline metal, an alkaline earth metal, and a rare earth metal here becomes tungsten bronze represented with $M_xWO_3$. The tungsten bronze has a vacancy of oxygen, and stabilizes ozone by absorbing the excess energy which is the cause of making ozone unstable, that is absorbing the excited electron into its vacancy, in coexistence with ozone. Further, because the tungsten bronze is a very stable compound, it is stable under the coexistence of ozone and does not cause oxidative deterioration due to ozone.

A typical tungsten bronze is $KWO_3$, and the inventors of the present invention can confirm that ozone gas of very high concentration can be produced and the ability of the ozonizer can be demonstrated to the fullest even in the case of using oxygen gas of high purity as raw material gas when the dielectric in which high purity alumina of purity of 99.5% is incorporated with 1 wt % of $KWO_3$ is used in the discharge cell. The ozone concentration did not increase even when nitrogen gas was added to the oxygen gas in a small amount. Therefore, it is considered to be certain that the decrease of the ozone concentration is effectively prevented in the case of using oxygen gas of high purity by incorporating $KWO_3$ and that the ability of the ozonizer is drawn out to the fullest.

The discharge cell for an ozonizer in the present invention was developed based on the related knowledge, and it is one in which a dielectric is arranged between electrodes contacting at least one of the electrodes to form a discharge gap for the generation of ozone between the pair of the electrodes, wherein transition metal bronze containing alkaline metals, alkaline earth metals, or rare earth metals at position A of transition metal oxide having a crystal structure in which an atom does not exist at position A of the perovskite structure exists on the surface of the dielectric.

In the discharge cell for an ozonizer in the present invention, ozone is produced in a discharge gap of the discharge cell. The ozone is in an excited state, the energy level is raised, and it is unstable. However, because a transition metal bronze having a vacancy of oxygen on the surface of the dielectric contacting the discharge gap exists, the excess energy level of the ozone in the excited state lowers and the ozone becomes stabilized. As the result, instant decomposition of the produced ozone to oxygen, which becomes a problem in the case of using oxygen gas of high purity, is avoided, and as the result, the ozone concentration increases.

The transition metal bronze may exist on the surface of the dielectric at a concentration of 0.1 to 2 wt %. In the case of less than 0.1 wt %, the effect of increasing the ozone concentration is insufficient, and on the other hand, the existence exceeding 2 wt % deteriorates adhesiveness of the transition metal bronze and the dielectric, and it possibly becomes a cause of contamination getting into the ozone gas.

There are many kinds of transition metals, and furthermore there are many kinds of their oxides. The kinds of the oxide are not especially limited. However, comprehensively judging the effect of increasing the ozone concentration, stability, durability, etc., $V_2O_5$, $Sb_2O_3$, $WO_3$, $Mn_3O_4$, $Fe_2O_3$, NiO, and $Co_3O_4$ are preferable, and may be used alone or two or more kinds may be mixed and used. The especially preferable transition metal oxide is $WO_3$, and tungsten bronze ($M_xWO_3$) is especially preferable as the transition metal bronze. Further, the tungsten bronze includes $KWO_3$ and $NaWO_3$, and among these $KWO_3$ is especially preferable. The reason why it is preferable is that $KWO_3$ is a very stable compound and there is less possibility that it becomes a cause of metal contamination when exposed to ozone.

It is possible to make the transition metal bronze exist only on the surface or the front layer part of the dielectric by coating etc. However, a material that is contained in the entire dielectric, what is called a bulk material, is preferable. A first advantage of a bulk material in which the transition metal bronze is dispersed and mixed into the dielectric is that the increase of ozone concentration can be effectively realized with a small amount of the transition metal bronze. By being able to reduce the amount of the transition metal bronze used, a dielectric constituting substance such as a large amount of alumina is exposed on the surface of the substrate, and hindrance of the objective of using its original constitution material can be avoided.

A second advantage is that by dispersing a small amount of the transition metal bronze into the dielectric constituting substance, deterioration of the planarity of the surface that becomes a problem at coating, especially a thick coating, can be avoided, and non-uniformity of the distribution of the gap amount due to the deterioration of this planarity can be avoided. Recently, there is a strong tendency that the gap amount is made small in the respect of efficiency of ozone generation, it is reduced to in the order of 0.1 mm or less depending on the ozonizer, and the uniformity of the distribution of the gap amount is an important technical problem. By the way, when the distribution of the gas amount becomes non-uniform, the performance deteriorates due to a non-uniform discharge.

High purity ceramics, especially alumina of 80% or more purity, are preferable, among these alumina 90% or more, and among these alumina 95% or more, and among these alumina of 99% or more is preferable as the dielectric constituting substance. The objective to use alumina is to secure cleanliness due to ozone resistance and sputtering resistance.

In the actual dielectric, a little amount of $SiO_2$ (silica), CaO (calcia), MgO (magnesia), etc. are incorporated as a sub raw material (sintering auxiliary agent) besides the dielectric constituting substance and the transition metal bronze. Other than the sub raw material, a very small amount of $Na_2O$, $K_2O$, $Fe_2O_3$, etc. is incorporated as an unavoidable impurity along with use of the raw material. Chromium oxide such as $Cr_2O_3$ may be incorporated as a sub raw material (sintering auxiliary agent). However, it is desirable to limit this to 3 wt % or less in a Cr element ratio in the respect of suppressing metal contamination of ozone gas.

Thickness of the dielectric is preferably 0.05 to 1 mm. When it is too thin, with stand voltage becomes low, and it becomes difficult to secure necessary mechanical strength. In the case that it is too thick, the distance between the electrodes becomes broad and discharge voltage becomes high.

The use of a conductive plate is typical as an electrode structure. However, a structure in which the electrode is formed as a thin film on the surface of an anti-discharge gap side of the dielectric is also preferable in the respect of preventing abnormal discharge. A material of the electrode film includes Cu, Ag, Al and Au. The thickness of the electrode film is preferably 5 to 70 μm. When it is too thin, it generates heat at a part where the pattern width is narrow, and there is a fear of generation of disconnection. In the case that it is too thick, there are many technical problems, and formation of an uniform film thickness is difficult. Adhesion of a metal foil, sputtering, vapor deposition, thermal spraying, screen printing, etc. are preferable as a method of forming the electrode film in the respect of making the film thickness uniform.

The discharge cell for an ozonizer in the present invention can stabilize the ozone that is produced in the discharge gap that is extremely active and unstable in view of the energy level by having the transition metal bronze having a vacancy of oxygen exist on the surface of the dielectric to from the discharge gap. Because of this, decomposition of the produced ozone can be stopped, and the decrease of the ozone concentration can be effectively prevented without adding nitrogen to the oxygen gas. As the result, the ability of the ozonizer can be drawn out to the fullest without adding nitrogen.

BRIEF DESCRIPTION OF THE DRAWING

FIG. 1 is a schematic section of the discharge cell for an ozonizer showing one embodiment of the present invention.

DETAILED DESCRIPTION OF THE PREFERRED EMBODIMENTS

The embodiments of the present invention are explained based on a drawing below. FIG. 1 is a schematic sectional view of the discharge cell for an ozonizer showing one embodiment of the present invention.

The discharge cell for an ozonizer in the present embodiment is provided with plate-shaped dielectrics 10, 10 arranged parallel to each other leaving a fixed space between them. The dielectrics 10, 10 consist of a sintered compact of alumina powder of high purity, and contain tungsten bronze ($M_xWO_3$) as a transition metal bronze, especially 0.1 to 2 wt % of $KWO_3$. Such dielectric 10 is manufactured by mixing a fixed amount of alumina powder, $KWO_3$ powder, and various powders and binders as a sub raw material (sintering auxiliary agent), molding the mixture into a plate shape, and sintering. The binders disappear at the sintering step.

The dielectrics 10, 10 are integrally bonded through a glass-based rib by a glass-based sealant, and a discharge gap 20, the surrounding of which is sealed with the sealant, is formed between the facing surfaces of the dielectrics. The discharge gap 20 formed between the dielectrics 10, 10 connects to the raw material gas flow path and the ozone gas flow path formed in a perpendicular direction at the outer periphery part of the dielectrics 10, 10. The smaller the gap amount of the discharge gap 20, the better it is because the ozone gas can be highly purified, specifically preferably 200 μm or less, and especially preferably 100 μm or less.

Each of film-shaped electrodes 30, 30 is formed on the surface of an anti-discharge gap side (back-face side) of the dielectrics 10, 10 by retaining the outer periphery part in a picture frame shape with adhesion of a metal foil, etc., and a high-frequency high-voltage power supply 40 is connected to these. One of the terminals of the power supply 40 is earthed, and the electrode 30 connecting to the terminal is called a low-voltage electrode and another electrode 30 is called a high-voltage electrode.

The discharge cell is configured by providing a plate-shaped cooling body in the back face side of the dielectrics 10, 10 further through an insulating plate. The plate-shaped cooling body may be a ceramic plate the same as the dielectric 10 and may be a metal plate. The cooling body of any of these shapes has a configuration in which cooling medium flows inside in the direction parallel to the plate face.

In the operation of the ozonizer, high purity oxygen gas is supplied to the discharge gap 20 of the discharge cell as raw material gas. The purity of oxygen gas is preferably 99.9% or more in the respect of cleanliness etc., and especially preferably 99.99% or more. Further, a fixed high-frequency high-voltage is applied between the electrodes 30, 30 to generate silent discharge in the discharge gap 20. Furthermore, cooling water as a cooling medium is supplied to the cooling body arranged in the back face side of the electrodes 30, 30.

The high purity oxygen flowing in the discharge gap 20 is exposed to the silent discharge and is ozonized, and ozone gas is produced. Because the high purity alumina is used in the dielectrics 10, 10 and high purity oxygen is used in raw material gas, the ozone concentration in the ozone gas is essentially low. Nevertheless, because $KWO_3$, which is the transition metal bronze, is incorporated in alumina constituting the dielectrics 10, 10, exists on the surface of the dielectrics 10, 10, and is exposed to the discharge gap 20, ozone gas of high concentration can be produced.

EXAMPLES

Next, the merit of compounding the transition metal bronze in alumina constituting the dielectrics 10, 10 is explained on $KWO_3$.

A high purity alumina powder sintered substrate of 99.5% purity was used as the dielectric in the Conventional Example. The transition metal bronze was not incorporated and the coating was not performed. The thickness was made to be 0.5 mm. The area of the discharge gap was made to be 100 cm$^2$, and the gap amount was made to be 0.1 mm (100 μm). Oxygen gas of 99.99% or more purity was supplied as the raw material gas at flow rate of 1 L/min and at pressure of 0.2 MPa. The supplying power was set to the maximum output of the ozonizer. The ozone concentration of the produced ozone gas was 10 g/m$^3$ (N) and it was extremely low. By the way, the target ozone concentration was 300 g/m$^3$ (N).

0.5 vol % of nitrogen gas was added to the above-described high purity oxygen gas. However, the ozone concentration was still 10 g/m$^3$ (N). That is, the effect of adding nitrogen gas was not realized.

One wt % of tungsten oxide ($WO_3$) was compounded to the high purity alumina of 99.5% purity when the dielectric was manufactured in the above-described Conventional Example as Comparative Example 1. The conditions other than this are the same as the Conventional Example. The ozone concentration of the produced ozone gas increased to 100 g/m$^3$ (N). However, it did not reach to the target ozone concentration. When 0.5 vol % of nitrogen gas was added to the above-described high purity oxygen gas, the ozone concentration increased to 200 g/m$^3$ (N).

One wt % of titanium oxide ($TiO_2$) was compounded to the high purity alumina of 99.5% purity when the dielectric was manufactured in the above-described Conventional Example as Comparative Example 2. The conditions other than this are the same as the Conventional Example. The ozone concentration of the produced ozone gas was 10 g/m$^3$ (N) and it was low. Nevertheless, when 0.5 vol % of nitrogen gas was added to the above-described high purity oxygen gas, the ozone concentration reached to 300 g/m$^3$ (N) which is the target concentration. That is, titanium oxide has the effect of increasing the ozone concentration rapidly by adding a small amount of nitrogen. However, there is almost no effect of increasing the ozone concentration without adding nitrogen.

One wt % of $KWO_3$, which is tungsten bronze, was compounded to the high purity alumina of 99.5% purity when the dielectric was manufactured in the above-described Conventional Example as Example 1 in the present invention. The conditions other than this are the same as the Conventional Example. The ozone concentration of the produced ozone gas reached to 300 g/m$^3$ (N) which is the target concentration even though high purity oxygen without adding nitrogen was used as raw material gas. When 0.5 vol % of nitrogen gas was added to the above-described high purity oxygen gas, the ozone concentration did not change and it was still 300 g/m$^3$ (N).

The compounding amount of $KWO_3$ was changed variously in Example 1 as Example 2 in the present invention. The relationship between the compounding amount of $KWO_3$ and the ozone concentration is shown in Table 1. For the ozone concentrations, each of the case of not adding nitrogen to the high purity oxygen gas which is the raw material gas and the case of adding 0.5 vol % of nitrogen gas was shown.

TABLE 1

| | | COMPOUNDING AMOUNT OF $KWO_3$ (wt %) | | | | |
|---|---|---|---|---|---|---|
| | | 0.05 | 0.1 | 1 | 2 | 2.5 |
| OZONE CONCENTRATIONS [g/m$^3$(N)] | HIGH PURITY OXYGEN ONLY | 224 | 288 | 325 | 308 | 257 |
| | HIGH PURITY OXYGEN AND NITROGEN | 249 | 296 | 330 | 312 | 266 |

It was confirmed that there is the effect of preventing the decrease of ozone concentration when the compounding amount of $KWO_3$ is 0.1 wt % or more not related to whether nitrogen is added or not as seen in Table 1. Further, when the compounding amount of $KWO_3$ exceeds 2 wt %, as described above, a problem of contamination occurs, and besides this, the tendency that the performance of generating ozone decreases not related to whether nitrogen is added or not even though there is a little difference. Therefore, the compounding amount of $KWO_3$ is preferably 0.1 to 2 wt %.

What is claimed is:

1. An ozonizer comprising a discharge cell wherein a dielectric is arranged between electrodes contacting at least one of the electrodes to form a discharge gap for the generation of ozone between a pair of the electrodes, wherein a transition metal bronze containing alkaline metals, alkaline earth metals, or rare earth metals at position A of the transition metal oxide having a crystal structure in which an atom does not exist at position A of the perovskite structure exists on the surface of the dielectric.

2. The ozonizer as in claim 1, wherein the transition metal bronze exists on the surface of the dielectric at a concentration of 0.1 to 2 wt %.

3. The ozonizer as in claim 1, wherein the transition metal oxide is $V_2O_6$, $Sb_2O_3$, $WO_3$, $Mn_3O_4$, $Fe_2O_3$, NiO, or $Co_3O_4$.

4. The ozonizer as in claim 3, wherein the transition metal oxide is $WO_3$ and the transition metal bronze is $M_xWO_3$.

5. The ozonizer as in claim 4, wherein the $M_xWO_3$ is $KWO_3$.

6. The ozonizer as in claim 1, wherein the dielectric is a bulk material incorporating the transition metal bronze throughout.

7. The ozonizer as in claim 1, wherein the dielectric is alumina with purity of at least 80%.

* * * * *